(12) United States Patent
Elfadel et al.

(10) Patent No.: US 7,979,825 B2
(45) Date of Patent: Jul. 12, 2011

(54) METHOD AND SYSTEM FOR THE CALCULATION OF THE SENSITIVITIES OF AN ELECTRICAL PARAMETER OF AN INTEGRATED CIRCUIT

(75) Inventors: Ibrahim M. Elfadel, Cortlandt Manor, NY (US); Tarek A. El Moselhy, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 554 days.

(21) Appl. No.: 12/059,163

(22) Filed: Mar. 31, 2008

(65) Prior Publication Data
US 2009/0248335 A1 Oct. 1, 2009

(51) Int. Cl.
*G06F 9/455* (2006.01)
(52) U.S. Cl. ........ 716/111; 716/106; 716/108; 716/112; 716/113; 716/115; 703/19
(58) Field of Classification Search .................. 716/4, 5, 716/6, 106, 108, 111, 112, 113, 115; 703/19
See application file for complete search history.

(56) References Cited

U.S. PATENT DOCUMENTS

| | | | |
|---|---|---|---|
| 6,018,623 A | 1/2000 | Chang et al. ............. | 395/500.07 |
| 6,654,943 B2 | 11/2003 | Clabes et al. ................... | 716/13 |
| 6,904,572 B2 | 6/2005 | Igarashi ........................... | 716/2 |
| 7,155,689 B2 | 12/2006 | Pierrat et al. ...................... | 716/4 |
| 2006/0059445 A1 * | 3/2006 | Shigyo et al. .................... | 716/5 |
| 2007/0124707 A1 * | 5/2007 | Sutjahjo et al. .................. | 716/4 |

OTHER PUBLICATIONS

"Nonoverlapping domain decomposition method for capacitance extraction of multilayered multiconductor transmission lines", by Hanqing Zhu, Shujing Liu, and Wei Hong, Microwave And Optical Technology Letters, vol. 48, No. 4, pp. 794-798 @Apr. 2006.*
"Finite Difference Method", http://en.wikipedia.org/wiki/Finite_difference_method , @ Oct. 31, 2007.*
"Network Sensitivity and Noise Analysis Simplified", by Franlin H. Branin Jr., IEEE Transactions on Circuit Theory, vol. CT-20, No. 3, @May 1973.*

(Continued)

*Primary Examiner* — Jack Chiang
*Assistant Examiner* — Nha T Nguyen
(74) *Attorney, Agent, or Firm* — Harrington & Smith (57) ABSTRACT

A method and system for determining electrical parameter data for a layer of an integrated circuit that can include a nominal electrical parameter value, and sensitivity values which represent the sensitivities of the nominal electrical parameter value to variations in the nominal parameter values. A template of the layer geometry is provided from a portion of which a set of linear equations are developed and which equations are solved using a two step method and from which solution the nominal electrical parameter values are determined. An auxiliary set of the original linear equations is developed from the original set using the adjoint method and from the solution of the auxiliary set using the two step method the sensitivity values are calculated.

18 Claims, 10 Drawing Sheets

OTHER PUBLICATIONS

"Rapid Method to Account for Process Variation in Full0Chip Capacitance Extraction" IEEE Transactions on Computer0Aided Design of Integrated Circuits and Systems, vol. 23, No. 6, Jun. 2004, pp. 941-951.

"Modified Nodal Approach to DC Network Sensitivity Computation", Nov. 1975, pp. 565-574.

F. Dorr, "The Direct Solution of the Discrete Poisson Equation in a Rectangle," SIAM Review, vol. 12, No. 2, Apr. 1970, pp. 248-263.

El-Moselhy et al., "Efficient Algorithm for the Computation of On-chip Capacitance Sensitivities with respect to a Large Set of parameters," DAC 2008, Jun. 8-13, 2008, Anaheim, CA USA, pp. 906-911.

* cited by examiner

- Discretized form based on the 5-point approximation $$\varepsilon_{+,+}(y(j+1)-y(j))\frac{\phi(i+1,j)-\phi(i,j)}{x(i+1)-x(i)}+\varepsilon_{+,+}(x(i+1)-x(i))\frac{\phi(i,j+1)-\phi(i,j)}{y(j+1)-y(j)}$$

$$+\varepsilon_{+,-}(y(j)-y(j-1))\frac{\phi(i+1,j)-\phi(i,j)}{x(i+1)-x(i)}+\varepsilon_{+,-}(x(i+1)-x(i))\frac{\phi(i,j-1)-\phi(i,j)}{y(j)-y(j-1)}$$

$$+\varepsilon_{-,+}(y(j+1)-y(j))\frac{\phi(i-1,j)-\phi(i,j)}{x(i)-x(i-1)}+\varepsilon_{-,+}(x(i)-x(i-1))\frac{\phi(i,j+1)-\phi(i,j)}{y(j+1)-y(j)}$$

$$+\varepsilon_{-,-}(y(j)-y(j-1))\frac{\phi(i-1,j)-\phi(i,j)}{x(i)-x(i-1)}+\varepsilon_{-,-}(x(i)-x(i-1))\frac{\phi(i,j-1)-\phi(i,j)}{y(j)-y(j-1)}=0$$

— Material & Geometry dependence

- Discretized linear system of equations depends explicitly on the parameter set
$$M(P)\phi(P)=\phi_0(P)$$

- Geometrical and material variations are contained in vector $P$

FIG. 4

- Capacitance can be obtained from the charge distribution

Field distribution at boundary $$C = \int_{\partial s} \hat{n} \cdot (\varepsilon \nabla \phi) d\ell$$

- Capacitance is a linear function of the parameter set (geometry, material properties)

$$C = \sum_{i,j\in\text{Binary Point}} \varepsilon_{+,-}(y(j+1)-y(j))\frac{\phi(i\pm1,j)-\phi(i,j)}{x(i\pm1)-x(i)} + \varepsilon_{+,-}(y(j)-y(j-1))\frac{\phi(i,j\pm1)-\phi(i,j)}{x(i\pm1)-x(i)}$$

$$+\varepsilon_{+,+}(x(i+1)-x(i))\frac{\phi(i,j\pm1)-\phi(i,j)}{y(j\pm1)-y(j)} + \varepsilon_{-,+}(x(i)-x(i-1))\frac{\phi(i,j\pm1)-\phi(i,j)}{y(j\pm1)-y(j)}$$

$$C = f(P, \phi(P))$$

FIG. 5

Capacitance is a function of the parameter set both explicitly and implicitly $$C = f(P, \phi(P)) \xrightarrow{\text{Diff. w.r.t. } P} \frac{dC}{dP} = \frac{\partial C}{\partial P} + \frac{\partial C}{\partial \phi(P)}\left(\frac{\partial \phi(P)}{\partial P}\right)$$

Difficult to calculate, requires FD solve

- Obtain difficult term from the governing linear system $$M(P)\phi(P) = \phi_0(P)$$

$$\xrightarrow{\text{Differentiate w.r.t. } P} \left(\frac{\partial \phi(P)}{\partial P}\right) = (M(P))^{-1}\left(\frac{\partial \phi_0(P)}{\partial P} - \frac{\partial M(P)}{\partial P}\phi(P)\right)$$

$$\frac{dC}{dP} = \frac{\partial C}{\partial P} + \frac{\partial C}{\partial \phi(P)}\left[(M(P))^{-1}\left(\frac{\partial \phi_0(P)}{\partial P} - \frac{\partial M(P)}{\partial P}\phi(P)\right)\right]$$

FIG. 6

- Governing equation $$\frac{dC}{dP} = \frac{\partial C}{\partial P} + \underbrace{\frac{\partial C}{\partial \phi(P)} (M(P))^{-1}}_{\Lambda} \left( \frac{\partial \phi_0(P)}{\partial P} - \frac{\partial M(P)}{\partial P} \phi(P) \right)$$

- Requires only two system soves to:
  - Determine nominal potential distribution
  - Determine the adjoint multiplier $$M(P)\phi(P) = \phi_0(P) \qquad (M(P))^T \Lambda^T = \left( \frac{\partial C}{\partial \phi(P)} \right)^T$$

- Complexity is independent of the number of parameters

Nominal System Matrices

$M_A(i)(j,j) = A(i,j)$
$M_C(i)(j,j) = B(i,j)$
$M_B(i)(j,j) = E(i,j)$
$M_B(i)(j-1,j) = C(i,j)$
$M_B(i)(j,j+1) = D(i,j)$

Sensitivity System Matrices

$M_A(i)(j,j) = B(i-1,j)$
$M_C(i)(j,j) = A(i+1,j)$
$M_B(i)(j,j) = E(i,j)$
$M_B(i)(j-1,j) = D(i,j-1)$
$M_B(i)(j,j+1) = C(i,j+1)$

Forward Step

$$H(i) = (M_A G(i-1) + M_B)^{-1}(M_D - M_A H(i-1))$$
$$G(i) = -(M_A G(i-1) + M_B)^{-1} M_C$$

Backward Step

```
NP=12 # Number of parms
BELOW=1 # layer below index
#th      diel         th      diel         th      diel
0.035    0.0460408    0.05    0.026562     0.075   0.026562
LAYER=2 # signal layer index
#th      diel         th      diel
0.075    0.026562     0.1     0.026562
ABOVE=3 # layer above index
#th      diel         th      diel         th      diel
0.035    0.0460408    0.05    0.026562     0.075   0.026562

Every three lines form a group of sensitivities

#The number of cols per line is NP, the num of parms

#The 1st line is the total side-to-side cap

-0.0198399  -0.0342108  -0.0342544  -2.6562      -2.99415e-15  -6.49506e-22  -0.134501   -1.777758e-24  -0.035239    -3.05845e-24  -0.345776    -0.0310876  -2.6562      -1.28321e-15  -0.0566426    48.7418

#The 2nd line is the total below cap

0.0399029   0.0691651   0.0691966   -2.99415e-15 -1.47771e-14  0.0399209    -1.777758e-24  0.0691966    0.062764     -8.54634e-19  -2.96299e-18  0.0627925    -0.0895046

#The 3rd line is the total above cap

1.764e-24   -2.73482e-18  -1.82322e-18  -1.47771e-14  0.0399209    0.0691966    -2.778719e-24  0.0627925    -0.0899611

#Note that the number of cols is not constant but depends on the index triplet.
#Note also that the last 4 cols in the file are the sensitivities of the outputs with respect to the combined parms.
#The combined parms are (in this order) total thickness below, total layer thickness, total thickness above and separation.
```

FIG. 15

METHOD AND SYSTEM FOR THE CALCULATION OF THE SENSITIVITIES OF AN ELECTRICAL PARAMETER OF AN INTEGRATED CIRCUIT

FIELD OF THE INVENTION

The present invention relates to a method and system for the calculation of the sensitivities of the parameters of an electrical parameter of an integrated circuit with respect to variations in design or semiconductor process parameters.

BACKGROUND

There are several views under which an integrated electronic circuit can be described, such as a logic view, a schematic view, and a layout view. The view that is closest to the actual fabricated circuit is the layout view where the geometric shapes of all the devices and the wiring connecting them are spelled out. A crucial step in the computer-aided design of an integrated circuit is to verify that the geometric shapes do indeed have the electrical parameter values that were intended in the design. This crucial step is called extraction, and it typically involves the handling of several millions of geometric shapes and their mapping onto electrical circuit parameters such as capacitance, resistance or inductance. The value of an electrical parameter is dependent on the values of the geometric, physical, and manufacturing process parameters. The said dependence is governed by the laws of physics, such as Maxwell's equations. The sensitivities of the electrical parameters are hereafter referred to as the dependent parameters while the geometric, physical, and process parameters will be called the independent parameters. The sensitivity of a dependent parameter with respect to an independent parameter measures the ratio of a change in an independent parameter to a very small and even an infinitesimal change of a given independent parameter with all other independent parameters remaining unchanged.

In computer operated extraction programs, the huge input data volume of the millions of geometric shapes is usually handled using pattern matching with fundamental geometric templates whose nominal values for various parameters of the electrical properties are pre-computed and pre-stored in lookup tables. These lookup tables are keyed to the values of the geometric parameters of a given shape such as the layer of the integrated circuit on which the shape resides, its immediate environment, and its dimensions. Available extraction programs include Assura-RCX (Cadence®), Star-RCXT (Synopsis®), and Erie and 3DX (IBM®). The pre-computed and pre-sorted table of templates is typically generated using nominal values for the electrical parameters.

It is well-known to those skilled in the art that the nominal values of the parameters of the electrical properties of the templates are not sufficient to electrically characterize the design. This is because during fabrication of the circuit the geometric shapes are going to be perturbed with respect to their nominal dimensions. This perturbation is mainly due to the deterministic and statistical variations in the process and design parameters of the manufacturing process and can be thought of in terms of tolerances relative to the nominal values.

One way to deal with variation caused by the perturbations is to generate several look-up tables for each of the fundamental geometric templates. Using this approach, each of the look up tables corresponds to one "corner" in the process and design parameter space. This approach is however no longer really viable in cutting edge IC fabrication due to the very large number of corners that exist in a complex integrated circuit. The number of such corners is being driven up due to the increase in complexity of the semiconductor design and the fabrication process. Therefore, this results in the increase in the number of parameters that have to be taken into account using the corner analysis technique.

Another approach can be used when the process and design parameters have small perturbations around their nominal values. In such a case it is known to use the mathematical partial derivatives (also known as sensitivities) of the nominal values of the design and process parameters as a shortcut to doing corner analysis. It has been found that when the perturbation is small, the corner values (sensitivities) can be obtained from the nominal ones using simple linear extrapolations. In the publication by Labun, A., "*Rapid Method to Account for Process Variation in Full-Chip Capacitance Extraction*," IEEE TRANSACTIONS ON COMPUTER-AIDED DESIGN OF INTEGRATED CIRCUITS SYSTEMS, Vol. 23, No. 6, June 2004, p. 941-951, the problem of calculating the sensitivities, that is, the change in the nominal values caused by the perturbations, of layout shape capacitances with respect to the parametric variations is considered. But the solution provided in this publication relies on the fact that the capacitance parameters of the fundamental templates are given by analytical formulas that are straight forward to differentiate in order to compute sensitivities. This approach is not suitable to the case of a large number of process and design parameters because such analytical formulas are very difficult to obtain. Furthermore, even when such a formula exists, it is not going to be accurate enough across the full ranges of the many parameters involved in the design of a modern day complex integrated circuit.

Chang, N. et al., "Method and System for Determining Statistically Based Worst-Case On-Chip Interconnect Delay and Crosstalk," U.S. Pat. No. 6,018,623, issued Jan. 25, 2000 uses sensitivities of the parameters of capacitance and resistance electrical properties to produce statistical models for integrated circuit performances when there are statistical variations in the process and design parameters. But Chang, et al do not teach how to compute the sensitivities of the parameters.

U.S. Patent Publication No.: US 2007/0124707 A1, May 31, 2007 of Sutjahjo, et. al., "Method and Apparatus for Facilitating Variation-Aware Parasitic Extraction" proposes a method for computing sensitivities. It addresses the same problem as the one addressed in the present invention, namely, how to augment the look-up table containing the nominal values of parameters of an electrical property as given in the fundamental templates with sensitivity information. One of the advantages of the method Sutjahjo, et al is that it reduces the calculation of sensitivities to that of solving a linear system of equations similar to the one used to compute the nominal values. However it is restricted to special kinds of linear systems, namely, those for which an upper-lower (LU) factorization is available.

Accordingly, a need exists to be able to efficiently determine the sensitivities of the various parameters of electrical properties of complex integrated circuits and whose solution involving a linear system does not suffer the above described restrictions of Sutjahjo, et al.

SUMMARY

According to one embodiment of the invention is a method for determining nominal values of an electrical parameter for a layer of an integrated circuit having wires and other components therein. In this embodiment, the method includes producing a template which describes geometry of a portion of the layer; producing a grid of nodes in the space between circuit elements enclosed by the template; determining for each selected node in the grid a set of discretized electrical quantities; determining explicitly or implicitly a coefficient matrix in a linear system which represents a relationship between the discretized electrical quantities and known values on a boundary; factorizing explicitly or implicitly the coefficient matrix using a two-step recursive method; and determining nominal parameter values of the electrical parameter using the set of discretized electrical quantities.

In accordance with another embodiment of the invention is a computer-readable storage medium storing instructions that when executed by a computer cause the computer to take actions to determine nominal parameter values of an electrical parameter for a layer of an integrated circuit having wires and other components therein. In this embodiment the actions include producing an interconnect template which describes geometry of a portion of the layer; determining from a selected node point of the template that is surrounded by a boundary a set of discretized electrical vector quantities; determining explicitly or implicitly a coefficient matrix in a linear system which represents a relationship between the discretized electrical quantities and known values on the boundary; factorizing explicitly or implicitly the coefficient matrix using a two-step recursive method; and determining the nominal parameter values of the electrical property using the set of discretized electrical quantities.

BRIEF DESCRIPTION OF THE DRAWINGS

Other objects and advantages of the invention will become more apparent upon reference to the following specification and annexed drawings in which.

DETAILED DESCRIPTION

In describing embodiments of the invention, although the process steps, method steps, algorithms or the like are described in a more or less sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

Embodiments of the present invention provide a method and system for computing the sensitivities of geometric physical (independent) parameters of integrated circuit electrical properties or parameters (dependent) such as capacitance, resistance, inductance and reluctance with respect to a large number of design and semiconductor process parameters.

One preferred embodiment of the invention, illustratively described with respect to determining sensitivities of the capacitance parameter, uses the finite difference method. The finite-difference method is a discretization of the integral form of Laplace's equation with space-dependent dielectric constant. This method is based on transforming the partial differential equation (PDE) and the boundary conditions satisfied by the electrostatic field into a set of linear equations. This in turn is accomplished using a discrete grid at whose node the values of the electrostatic field and its derivatives are computed. The solution of this set of linear equations yields the nominal values for the various parameters.

One advantage of the finite-difference method is that it easily enables the treatment of circuits with finely stacked dielectrics having different dielectric constants as is the case in integrated circuits interconnect. In accordance with the invention, the back-end-of-the-line (BEOL) technology data describing the stacked dielectrics and the metallization is combined with properly parameterized geometric structures describing the relative positions of interconnect wires to formulate the electromagnetic equations defining the electrostatic interactions between these wires. Subsequently, the finite-difference method is applied, and a nominal linear system is used to compute the capacitance matrix of all the wires. One advantage of the invention is that the nominal linear system is only implicitly formed and then solved using the so-called two-step, or two sweep, method as per F. Dorr, "*The Direct Solution of the Discrete Poisson Equation in a Rectangle*," SIAM REVIEW, Vol. 12, No. 2 April 1970, pp. 248-263, to obtain the nominal values of the electrical property, such as the capacitance. The two-step, or two-sweep method, is an iterative procedure for solving the finite-difference equations resulting from discretizing the Laplace or Poisson partial differential equations in a rectangle. As will become clear from the detailed description of the invention, the rectangular geometry is one of the most common presentations when dealing with wiring structures in integrated circuits.

Once the nominal system is solved, another linear system is formed, the auxiliary linear system derived from the adjoint method as per F. H. Branin, Jr. "*Network Sensitivity and Noise Analysis Simplified*," IEEE TRANSACTIONS ON CIRCUIT THEORY, Vol. CT-20, No. 3, May 1973. The solution of the auxiliary system gives the sensitivity values of the parameters. It is an advantage of the present invention that this auxiliary linear system can also be solved with the very same nominal two-step algorithm after a few algebraic transformations.

The teachings of the present invention can be readily included in computer-aided design tools such as full-chip or macro parameter extraction in order to evaluate the impact of manufacturing and design parameter tolerances on circuit performance. This inclusion can be done via the expansion of the capacitance lookup table of the extraction tool to include the sensitivity information provided. Furthermore, the teachings of the present invention can be used in an optimization methodology to find the geometric circuit layouts that best satisfy one or several design criteria. It is well known that the best optimization methodologies are those in which the achievement of the optimization goals is guided using the sensitivity information of the optimization criterion with respect to the parameters of the problem. The present invention provides the sensitivities of various electrical parameters, such as capacitance, with respect to geometric, physical and manufacturing process parameters and thus enables the calculation of sensitivities of optimization functions with respect to all the independent parameters involved in the optimization. Another outcome of the teachings is to enable a single-run-multiple-corner electrical verification methodology that would be much more efficient than that obtained using the multiple-corner methodology. As mentioned above, explicitly computing parameter values of an electrical property for all design and manufacturing corners of an integrated circuit is time consuming and it is becoming tedious to undertake the exhaustive corner analysis that is needed for accurately assessing integrated circuit performance. With the present invention, obtaining parameter sensitivity information at a few selected corners will enable the calculation of electrical parameter sensitivities at other corners using fast interpolation and extrapolation methods without impacting accuracy.

Certain preferred embodiments of this invention have the advantage of being adapted, but not restricted, to the finite difference method for extracting nominal and sensitivity values of electrical circuit parameters. Other methods that can be used with embodiments of this invention include the finite-element method and the boundary-element method.

Considering capacitance parameters sensitivity calculation as a specific but not restrictive example of an embodiment of the present invention, it provides a significant improvement over the method proposed in Sutjahjo, et al in the following ways:

The method of Sutjahjo, et al is restricted to the case where the capacitance matrix is represented by a potential coefficient matrix. This is typically the case when an integral formulation is used to express Maxwell's electrostatic equation. The method of the present invention is an improvement on that of Sutjahjo, et al in that it extends capacitance sensitivity calculations well beyond the integral formulation case. In particular, the present invention shows how efficient sensitivity computation can be done using the finite-difference method.

The solution of the method of Sutjaho, et al is restricted to the case where an upper-lower (LU) factorization is needed to solve for the nominal values of the capacitance parameters. It requires the explicit setup of the full potential coefficient linear system. The method of the present invention does not suffer such restriction since nominal capacitance values and their sensitivities can be had even if the linear system is not explicitly set up, an LU factorization is not available or, when available, an LU factorization is very expensive to compute.

The method of Sutjahjo, et al has the shortcoming of requiring explicit backward and forward substitutions for each process or design parameter with respect to which capacitance parameter sensitivities are being computed. These substitutions are algebraic operations done using the coefficients of the LU factorization in order to compute the ultimate solution of the linear system. The backward substitutions are associated with the upper U matrix while the forward substitutions are associated with the lower L matrix. Therefore, in using the method of Sutjahjo the computational cost is dependent on the number of parameters. This is not the case in the present invention where the cost is independent of the number of parameters since all of the parameters are addressed at the same time in solving the set of linear equations for each of the nominal values and the sensitivities.

The method of Sutjahjo, et al also has the shortcoming of requiring direct differentiation of the potential coefficient matrix that is typically very dense. This is a result of Sutjahjo's adoption of the integral formulation. The present invention is adapted to the sparsity of the finite difference method and can in fact be applied to any formulation.

One exemplary method according to the present invention is adapted to the two-step solution method for finite difference formulations and also can be adapted to any other formulation including those in which the system matrix is formed only implicitly. Examples include three-dimensional hierarchical boundary-element, fast multiple, or pre-corrected fast Fourier transform (FFT) formulations.

The described techniques of the embodiments of the invention may be implemented as a method, apparatus or article of manufacture involving software, firmware, micro-code, hardware and/or any combination thereof. The term "article of manufacture" as used herein refers to code or logic implemented in a medium, where such medium may comprise hardware logic [e.g., an integrated circuit chip, Programmable Gate Array (PGA), Application Specific Integrated Circuit (ASIC), etc.] or a computer readable medium, such as magnetic storage medium (e.g., hard disk drives, floppy disks, tape, etc.), optical storage (CD-ROMs, optical disks, etc.), volatile and non-volatile memory devices [e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.]. Code in the computer readable medium is accessed and executed by a processor. The medium in which the code or logic is encoded may also comprise transmission signals propagating through space or a transmission media, such as an optical fiber, copper wire, etc. The transmission signal in which the code or logic is encoded may further comprise a wireless signal, satellite transmission, radio waves, infrared signals, Bluetooth, etc. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may comprise a combination of hardware and software components in which the code is embodied, processed, and executed. Of course, those skilled in the art will recognize that many modifications may be made without departing from the scope of embodiments, and that the article of manufacture may comprise any information bearing medium. For example, the article of manufacture comprises a storage medium having stored therein instructions that when executed by a machine results in operations being performed.

Figure 15:
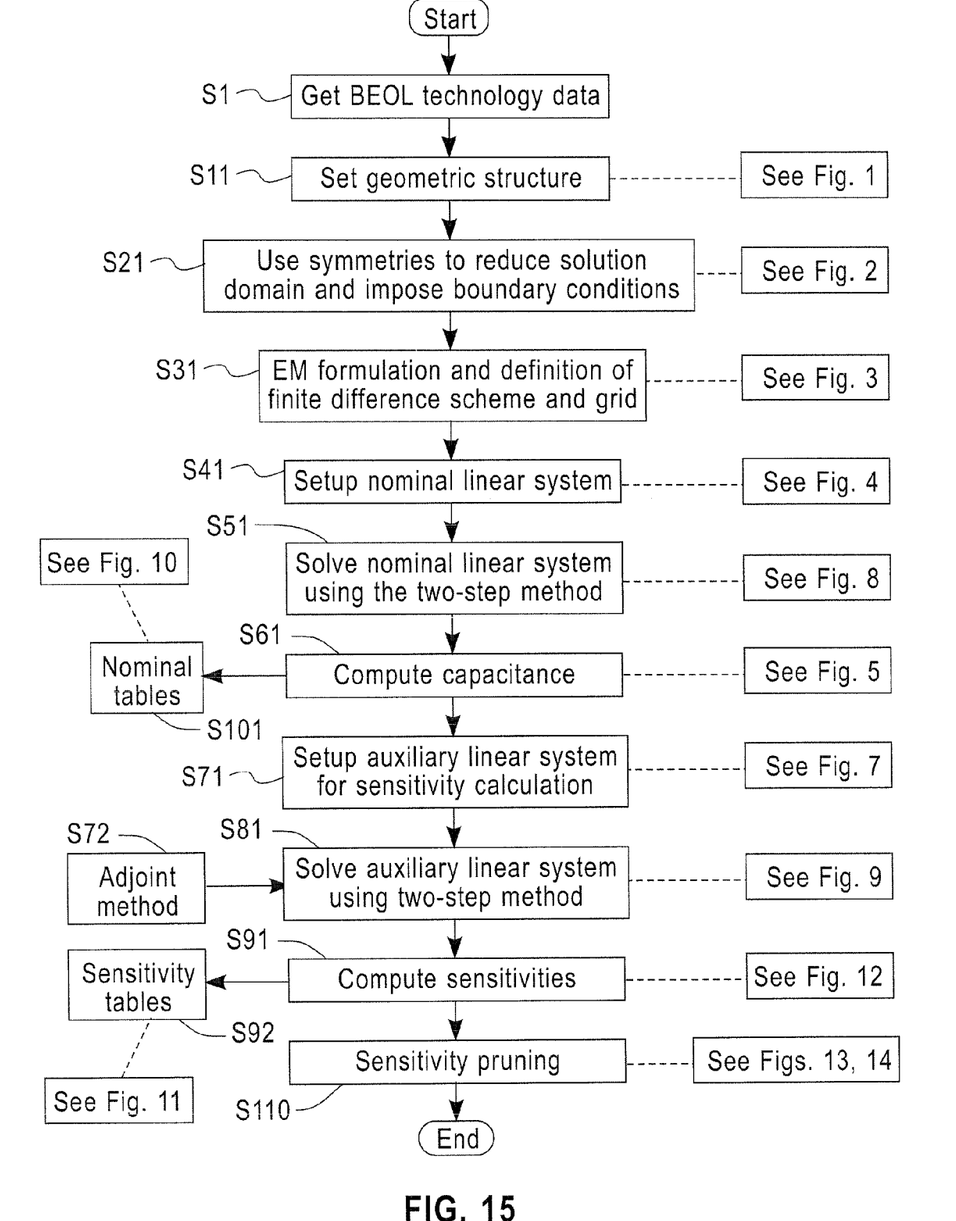
FIG. 15 is a flowchart showing the various steps of the method of the subject invention.

FIG. 15 is a flow chart showing the invention that is keyed to the drawings which are described in greater detail below. It should be understood that the invention includes a system computer based implementation of the various steps of the method such as formulating coding for the original template geometry and solving the various mathematical equations produced as the method proceeds and is implemented. Also, while the preferred embodiment of the invention is described with respect to determining nominal values and sensitivity of the capacitance parameters of an integrated circuit layer, it also can be used in the determination of the nominal and sensitivity values of other electrical properties such as resistance, inductance and reluctance.

The process starts at step S1 in which the technology data is provided. The technology data comprise a detailed description of the semiconducting, conducting, and dielectric materials used in the fabrication of the integrated circuit. For the illustrative example of capacitance, the technology data will include the thicknesses and dielectric constants of the various dielectric layers or sublayers used in the back-end-of-line (BEOL) metal stack.

In step S11 the geometric structure of the integrated circuit is set. That is, a drawing of the layout of the part of the integrated circuit to be analyzed is made. This can be a portion of one layer of a multi-layer integrated circuit.

In step S21 boundary conditions are imposed on the integrated circuit structure of S11 using symmetries of the geometric structure for the purpose of reducing the solution domain.

In step S31 the electromagnetic (EM) field equations, Maxwell equations, are formulated together with a definition of the mathematical finite difference scheme and grid to be applied. The EM formulation takes into account that the dielectric medium of the circuit layer is non-homogeneous, that is, made of dielectric materials having different dielectric constants.

Step S41 is the set up of a nominal linear equation system corresponding to the geometric parameters of the grid points developed in S31.

In S51 the equations of the nominal linear system set up in S41 are solved using the two step method.

In step S61 the nominal values of the electrical parameters are calculated form the solution of S 51. Tables of the nominal values of the electrical parameters at the corner being analyzed are developed from the S61 calculation in step S101.

In S71 an auxiliary linear equation system, that is, a modification of the linear system developed in S41, is set up based on the solutions of S51 using the adjoint method of S72.

S81 is the solution of the equations of the auxiliary linear system set up in S71 using the two-step method.

In S91 the solution of the auxiliary system equations of S81 is used to compute the parameter sensitivities. From the results of S91 the tables for the sensitivities are produced in S92.

In S110 the pruning of the results of the sensitivity computations, that is, the selection of those parameters whose change most impact the electrical parameter under consideration.

S110 is the end of the process.

Figure 1:
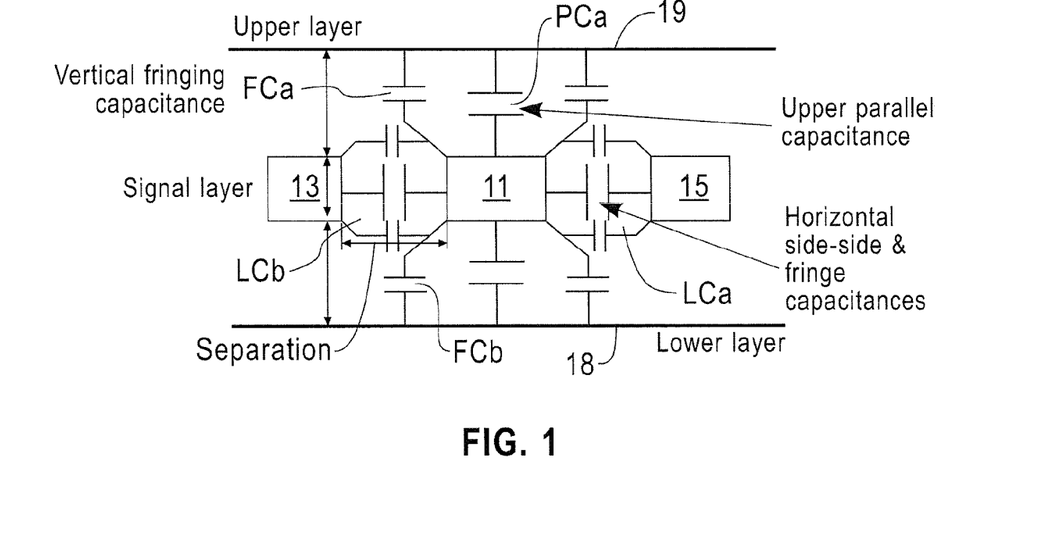
FIG. 1 is a geometric template showing an elevation view of a portion of an integrated circuit.
Figure 10:
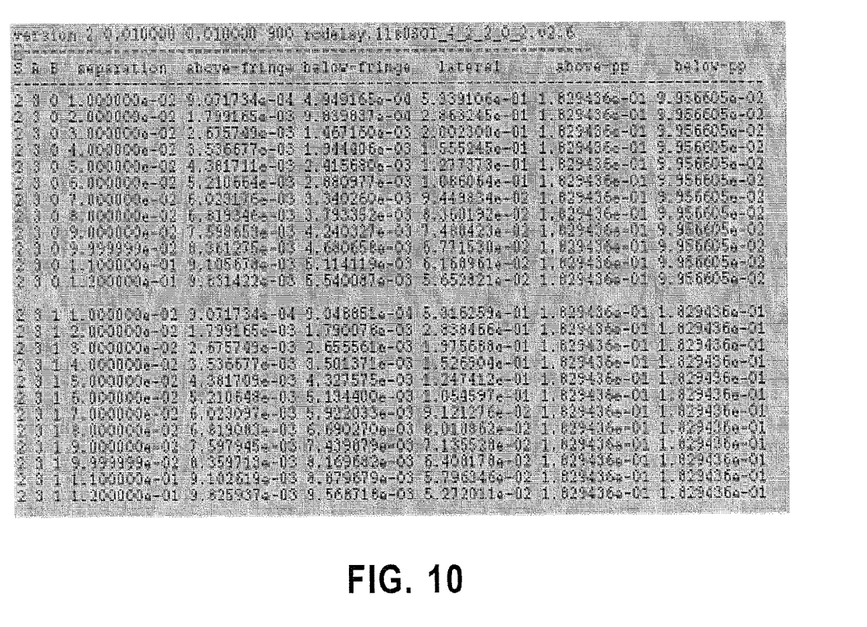
FIG. 10 shows an example of a lookup table containing nominal values.
Figure 11:
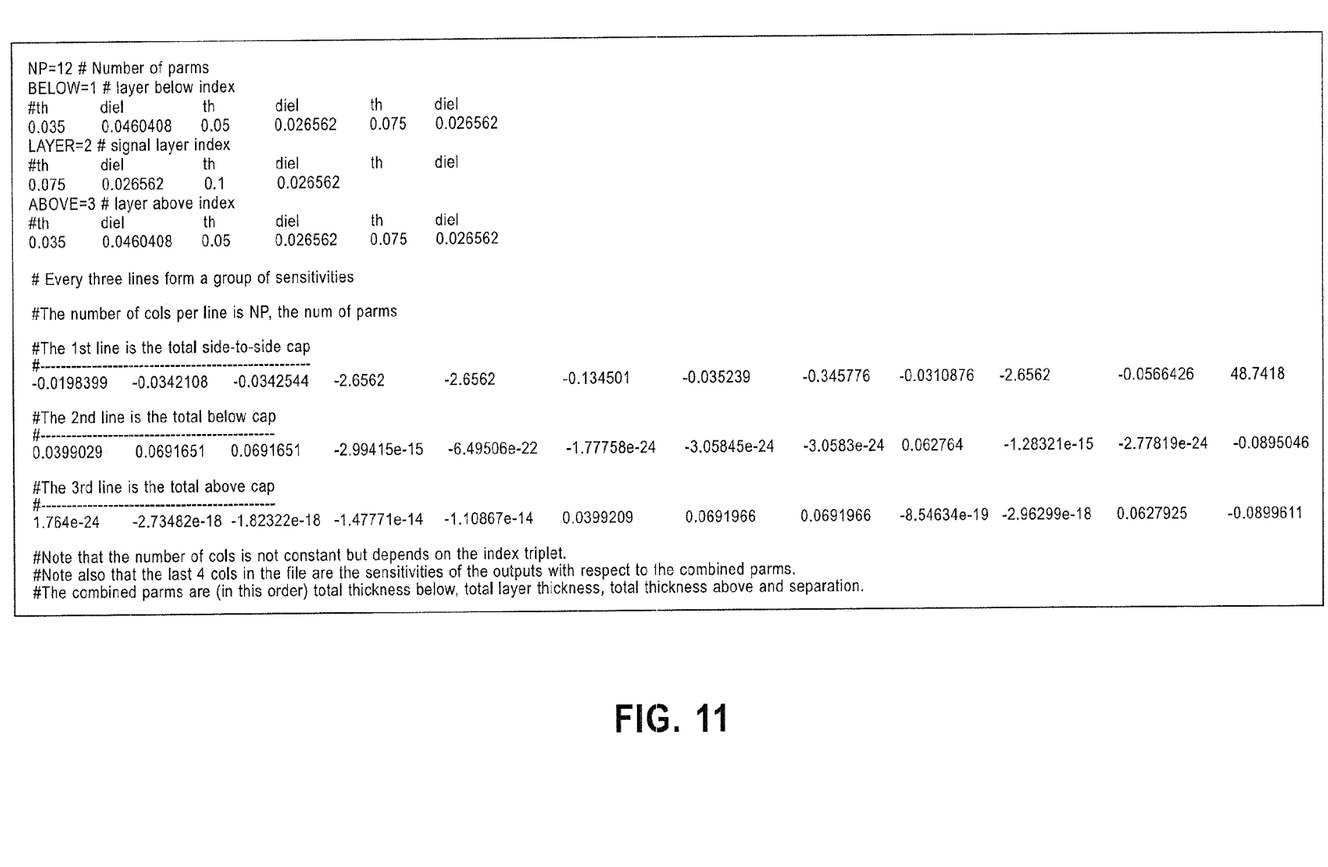
FIG. 11 shows an example of a lookup table containing sensitivity values.

Turning now to the individual figures of the drawings which further describe the above steps, FIG. 1 (S11) shows the fundamental geometric template 10 to be used in the calculation of nominal and sensitivity tables of the desired electrical parameters. The nominal tables are used to store the nominal values of the desired electrical parameter. Their entries are keyed to the independent geometric parameters of the specific shapes extracted from the design layout of the integrated circuit. The sensitivity tables are used to store the sensitivity values of the desired electrical parameter. Their entries are also keyed to the independent geometric parameters of the layout shapes. The fundamental template 10 also is called a centered pattern as it comprises one central wire 11 neighbored by a wire 13 and 15 on each side of it. These three wires are sandwiched between two metal layers 18 and 19 below and above the wires. FIG. 1 also shows the kind of capacitance parameters whose nominal values and sensitivities need to be calculated for the fundamental template. They are the parallel capacitances PCb and PCa (below and above), the fringe capacitances FCb and FCa (below and above), and the lateral (side-to-side) capacitances LCa and LCb. The parameters of separation between the wires, lower layer index, signal layer index and upper layer index are the entry keys for the nominal and sensitivity tables for the capacitance electrical parameter, as shown in FIGS. 10 and 11, to be developed.

Figure 2:
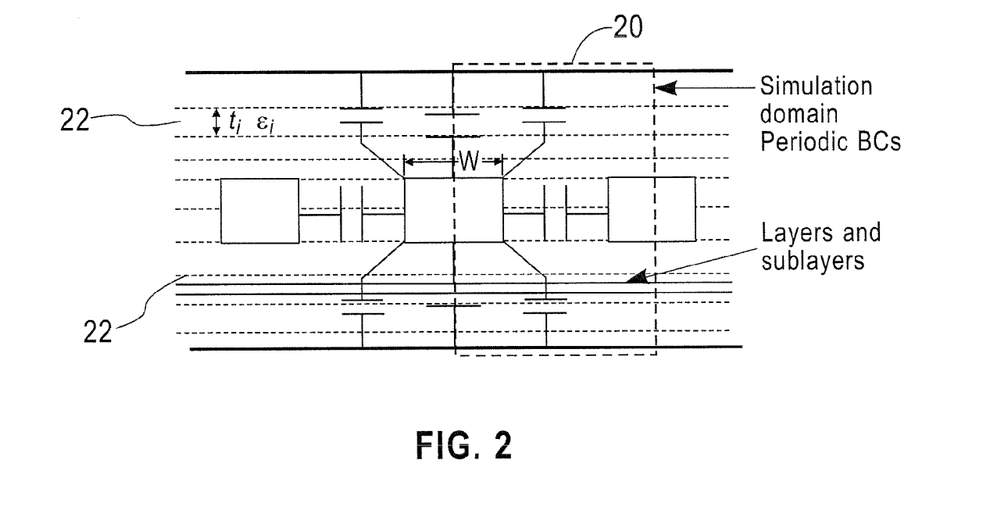
FIG. 2 is an elevational view of a geometric template showing the domain on which a finite-difference simulation is to be made.

One particular aspect of the geometry of FIG. 1 is that it also comprises several horizontal sub-layers that are made of dielectric materials. This is shown in FIG. 2 (S21). In FIG. 2 the dashed line box 20 delimits the domain on which the finite-difference simulation is to be done. The dashed horizontal lines 22 are the boundaries between different dielectric sublayers, with each sublayer having its own thickness and dielectric constant. It should be noted that each of these sublayers can impact both the nominal capacitance values of as well as the sensitivity values as computed using the finite-difference simulation.

FIG. 2. also shows that the physical symmetry of the structure can be exploited to restrict the solutions for all the capacitance parameters to the domain enclosed in the dashed box 20. In the illustrative example being described, there are five capacitance parameters to compute within this restricted domain inside the dashed box. These are: the lateral (side-to-side) capacitance; the parallel-plate capacitance to the plane above; the parallel-plate capacitance to the plane below; the fringing capacitance to the plane above; and the fringing capacitance to the plane below.

It is well known to those skilled in the art that the wiring in high-performance integrated circuits runs on several stacked metal layers (back-end-of-the-line or BEOL stack). Therefore, the main parameters that will be used as entry keys in the capacitance parameter tables generated for the fundamental template of FIG. 1 are the indices of the bottom layer, the wire layer, and the top layer as well as the separation distance between the wires.

The preferred embodiment of this invention uses the finite difference method for computing capacitances. The finite-difference scheme is a discretization of the integral form of Laplace's equation with space-dependent dielectric constant.

This method is based on transforming the partial differential equation (PDE) and the boundary conditions satisfied by the electrostatic field into a set of linear equations.

Figure 3:
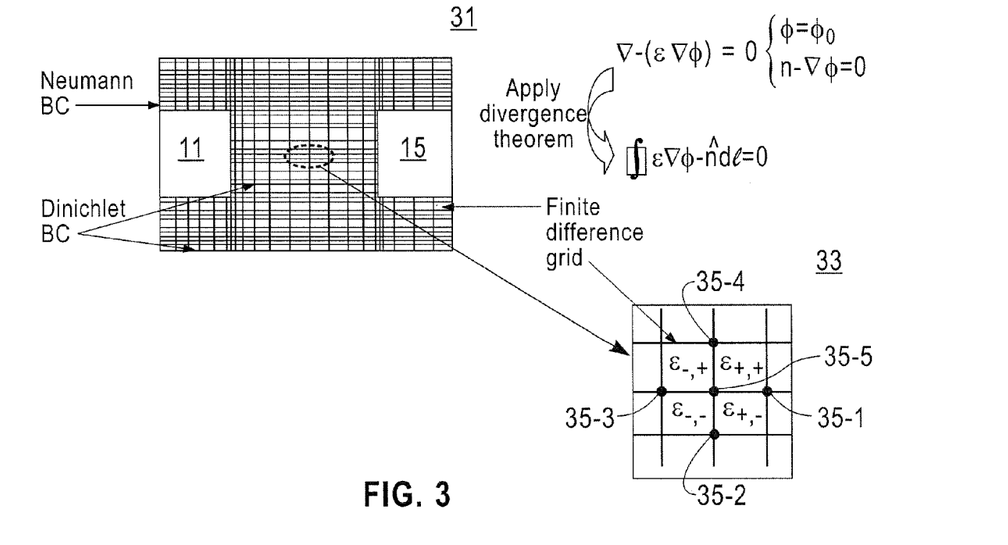
FIG. 3 is a presentation of the grid on which the finite-difference scheme is defined.

As shown in FIG. 3, the transformation is accomplished using a discrete grid at whose nodes the values of the electrostatic field and its derivatives are computed using a five point finite difference scheme. FIG. 3 (S31) shows such a grid as applied to two of the wires, illustratively wires 11 and 15 of FIG. 1. The preferred embodiment uses a non-uniform grid to more accurately capture derivatives at the boundaries where a denser network of nodes is used close to the conducting surfaces. The grid depends on the layer dimensions. FIG. 3 also shows the PDE and the boundary conditions of the electrostatic potential $\phi$. This equation has an integral form that is more amenable to discretization than the differential form. In FIG. 3 a part 32 of the grid 31 is enlarged at 33 to show five points, or nodes, 35-1 ... 35-5 from which the discretization is developed.

Figure 4:
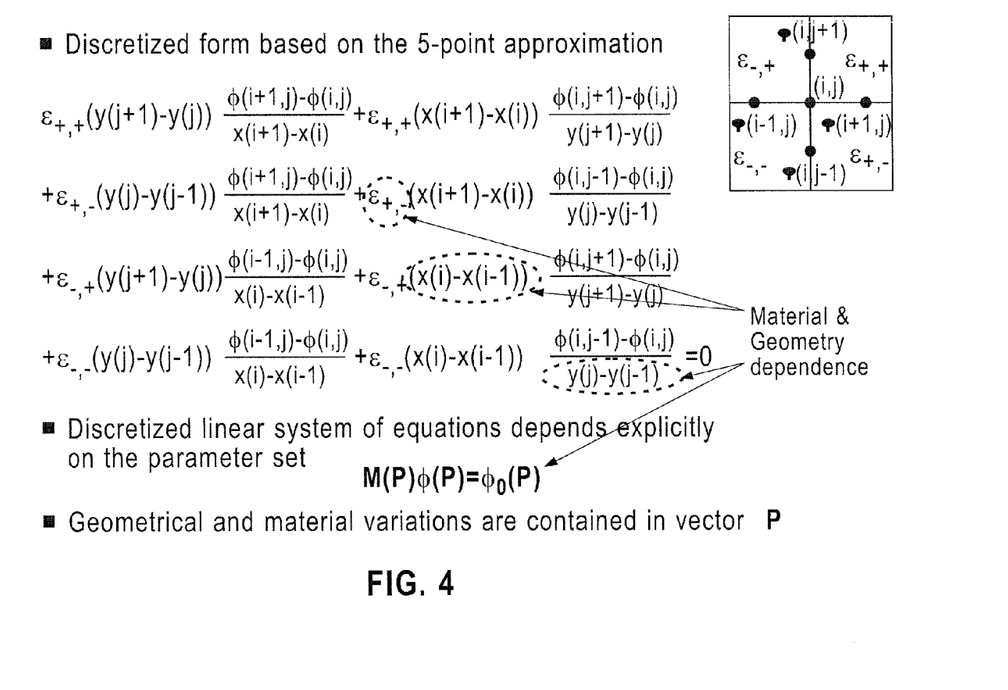
FIG. 4 shows the details of the five-point discretization at the node point of the grid shown on FIG. 3.

FIG. 4 gives further details on 5-point discretization showing how the resulting linear system depends on the geometric parameters of the template. The system matrix and the known right hand side depend explicitly on the geometric and material parameters. The solution, which is the vector of potentials φ(i, j) at the grid points, depends implicitly on the geometric and material parameters.

In FIG. 4 (S41), one instance of the linear equations into which the PDE of FIG. 3 is reduced is shown. It is based on a five-point finite-difference scheme. These instances can be combined in a linear system $M(P)\phi(p)=\phi_0(P)$, where P is the set of geometric parameters on which the solution depends.

If the electrical parameters being calculated are of capacitance, the finite-difference system matrix $M(P)\phi(p)=\phi_0(P)$ has to be solved to get the potential distribution at the grid points 35, and in particular at those points that fall right at the surfaces of the wires. The surface potential distribution can then be used to calculate the surface charge distribution from which the parameters can be derived according to the summation formula given in FIG. 5.

Figure 5:
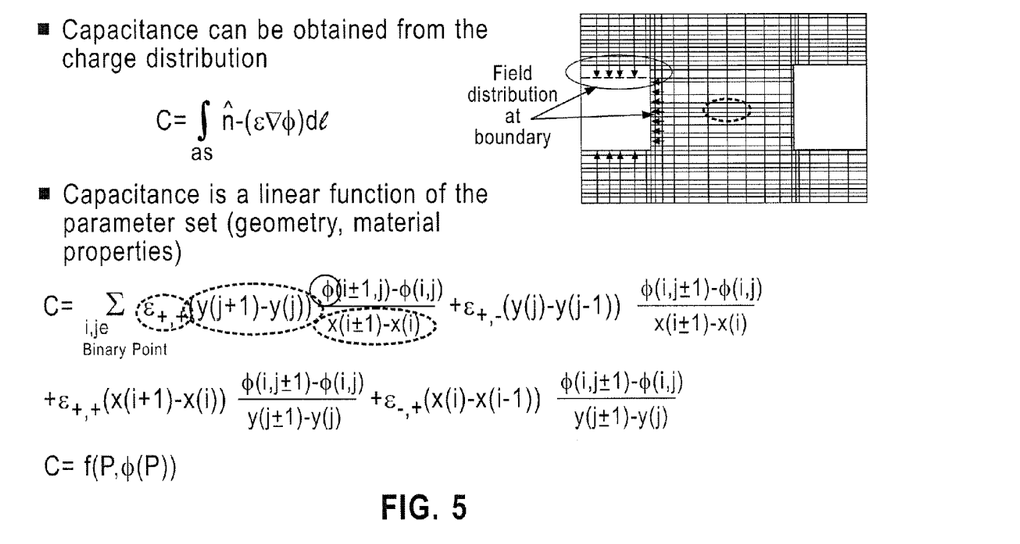
FIG. 5 shows the calculation of the capacitance value using the surface integration of charge densities determined from the discretization of FIG. 4.

FIG. 5 shows the calculation of parameters using the surface integration of charge densities. The discretization of the integration formula uses the finite-difference scheme and the dependence of the parameters on the geometric and material parameters both directly through the coefficients of the summation formula and indirectly through the potential function.

FIG. 5 (S61) shows how the parameters are computed once the electrostatic potential is obtained from the linear system solution of FIG. 4. The exact value of the capacitance C is obtained using a surface integral formula where the integrand is essentially the charge density over the conducting surface. The finite-difference approximation of the capacitance is given by the summation formula that can be compactly represented in the functional form $C=f(P,\phi(P))$. It should be noted that in this functional form as shown in FIG. 5, the capacitance C depends both explicitly (through the coefficients of the linear summation formula) and implicitly (through the electrostatic potential $\phi(P)$) on the geometric and material parameters P of the fundamental template of FIG. 1.

Figure 7:
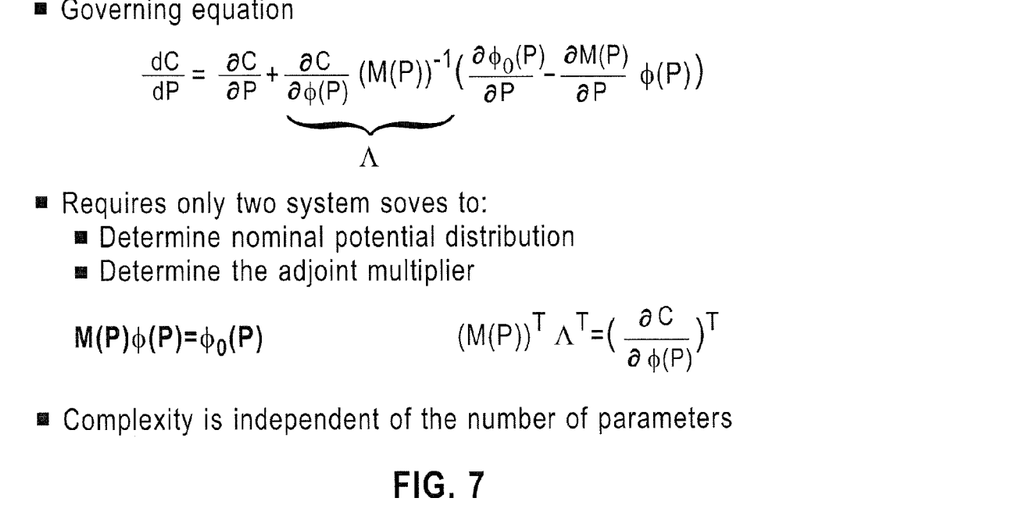
FIGS. 7 and 8 show the details of deriving the adjoint method for computing sensitivities with the bottom of FIG. 8 showing the two linear systems, the nominal system on the left and the adjoint system on the right.

Once the functional dependence of C is found, the next step is to compute the sensitivities of the capacitance C with respect to the parameters P. The mathematical procedure that the method and system of the invention are based on for doing this is shown in FIG. 7 (S71). A straightforward differentiation of the function $C=f(P,\phi(P))$ with respect to the parameters P will result in the appearance of the term $$\frac{\partial \varphi(P)}{\partial P}$$

which is very prohibitive to compute when the number of parameters in the vector P is very large. Methods that do compute this term are called "direct methods," and while they are acceptable for the cases when the number of parameters is very small (fewer than 4), they become too costly when this number is large. A typical number of parameters for the BEOL (back-end-of-the-line or BEOL stack) process is about 60 parameters. When transistor devices are included this number can easily run into the hundreds. It is this latter case to which the present invention is directed.

Figure 6:
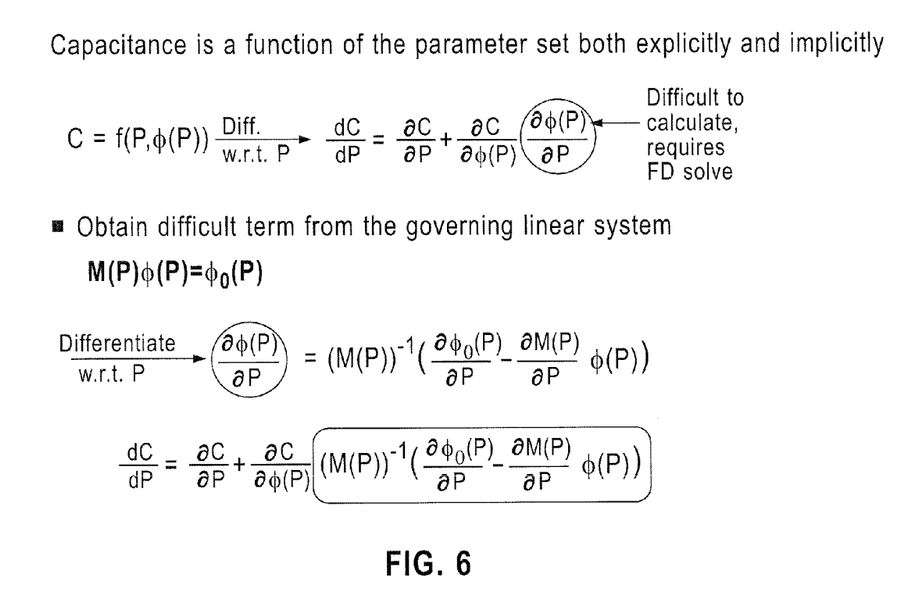
FIG. 6 upper equation shows the details of using the prior art time-consuming direct method for the nominal capacitance value calculation of FIG. 5.

In FIG. 6 (S72) the prior-art direct method for capacitance calculation is shown. The direct method basically uses individual parameter perturbation in order to compute sensitivity using the ratio of capacitance variation with respect to parameter variation. This would have been used if the number of parameters is small (less than 4). The invention deals with possibly hundreds of parameters and this is why the use of the adjoint method is preferred.

An exemplary method of the invention bypasses the calculation of the term $$\frac{\partial \varphi(P)}{\partial P}$$

of FIG. 6 by using the linear system satisfied by φ(P) as shown in FIG. 6. This method is similar to what is known in electrical network theory as the "adjoint method" (Ref: F. H. Branin, Jr. "*Network Sensitivity and Noise Analysis Simplified*," IEEE TRANSACTIONS ON CIRCUIT THEORY, Vol. CT-20, No. 3, May 1973) which describes a method in which sensitivities of network functions with respect to a large number of circuit elements are desired. In the present invention, it is desired to find the sensitivities of a circuit element (e.g., capacitance) with respect to a large number of geometric and material parameters. Furthermore, in this preferred embodiment, the sensitivities of the electrostatic vector φ(P) are replaced with those of the much simpler functions $\phi_0(P)$ and M(P) which can be computed by inspection.

FIG. 7 shows how to determine the sensitivities with respect to all the capacitance parameters using the simpler functions $\phi_0(P)$ and M(P). FIG. 7 shows that what is required is the solving of only two linear systems, these being: the nominal system and the auxiliary system set up using the adjoint method.

FIG. 7 (S81) shows the steps to be followed to compute the capacitance sensitivities:

1) Compute $$\frac{\partial C}{\partial P} \cdot S(72)$$

2) Compute $$\frac{\partial \varphi_0(P)}{\partial P} \text{ and } \frac{\partial M(P)}{\partial P} \cdot (S72)$$

3) Solve the main linear system $M(P)\phi(P)=\phi_0(P)$, which gives the potential distribution φ(P) over the grid points.

4) Compute $$\frac{\partial \varphi_0(P)}{\partial P} - \frac{\partial M(p)}{\partial P}\varphi(P)(S72)$$

5) Solve the auxiliary linear system $$\Lambda M(P) = \frac{\partial C}{\partial \varphi(P)}(S71)$$

with the unknown row vector Λ, which gives the auxiliary vector Λ. This auxiliary vector is used in 6) below to compute all the sensitivities with respect to all the components of P at once.

6) Compute $$\frac{dC}{dP} = \frac{\partial C}{\partial P} + \Lambda\left(\frac{\partial \varphi_0(P)}{\partial P} - \frac{\partial M(p)}{\partial P}\varphi(P)\right).$$

All of this is occurring during steps S71 and S72.

Embodiments of the invention as described above represent an improvement on the prior art of Sutjahjo, et al in that it is well adapted to the case where the matrix M(P) is known only implicitly and therefore no LU factorization (a type of mathematical solution) has to be computed as is required in that publication.

Figure 8:
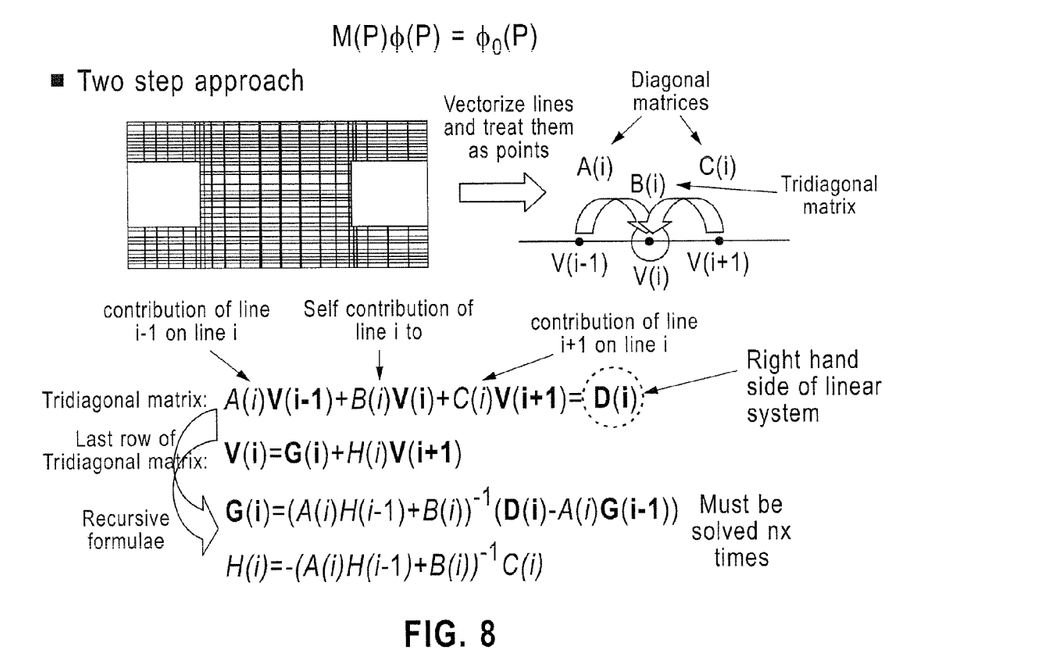

In one preferred embodiment of this invention, the two-step method for solving the finite-difference system is used to demonstrate this advantageous feature of the present invention. The main equations of the two-step method are shown in FIG. 8 (S51), and should be familiar to those skilled in the art. It is an advantage of the present invention that the auxiliary system solved in step 5) above can also be solved using the two-step method and thus requires no LU factorization of the system matrix.

FIG. 8 (S51) shows the two-step approach for solving the nominal linear system, i.e, to obtain the nominal capacitance parameter values. The same basic two step method is used to solve the auxiliary system, i.e. to obtain the sensitivity values. FIG. 8 shows the two linear systems: the nominal system on the left and the adjoint system on the right.

Figure 9:
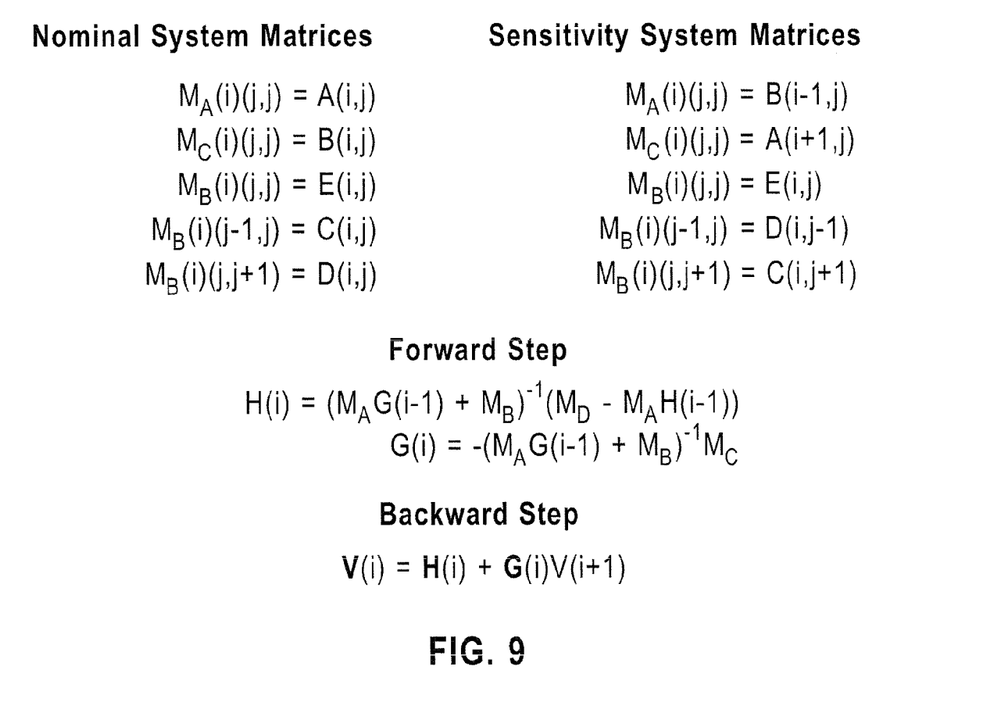
FIG. 9 shows the details of how to transform the two-step method for solving the nominal system into a two-step method for solving the adjoint system of FIG. 7.

FIG. 9 (S81) shows the adaptation of the two-step approach to the solution of the auxiliary system so as to obtain the sensitivities. It should be noted that the nominal and sensitivity systems differ only in the definition of the matrices used in the two-step recursion process. The adaptation is essentially a re-labeling of the recursion matrices of the two-step method used to solve the main linear system of step 3) above. C-a26

In FIG. 10 (S101), shows an example of a table showing the nominal values of capacitance parameters that are produced as a result of solving (S61) step 3) above. The five rightmost columns are the different capacitance parameters that correspond to the fundamental template of FIG. 2. These illustratively are the side by side capacitance between two wires including fringe capacitance, upper parallel plate capacitance, upper fringe capacitance, lower parallel plate capacitance and lower fringe capacitance. The values of other parameters can be computed as desired and needed. The four leftmost columns are the keys used to access these values. A full table can have as many 250,000 keys.

In FIG. 11 (S92), an example of a table of the sensitivity values is shown. The sensitivities are those of the capacitance parameters of a fundamental template located on layers 1, 2 and 3 of a BEOL metal stack. The number of geometric parameters used in the sensitivity calculation illustratively is 12, although other numbers of parameters can be used. Every line in the sensitivity table of FIG. 11 results from computing the equation of step 6) above after solving the auxiliary system in step 5) above.

Figure 12A:
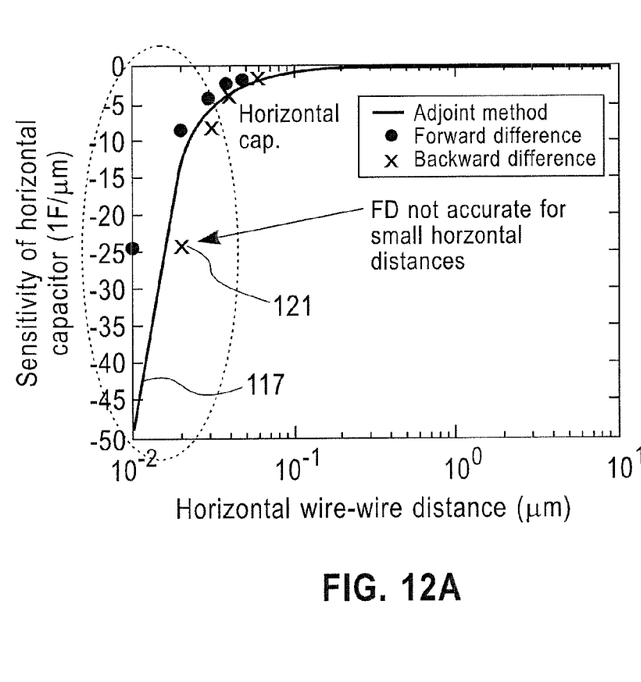
FIG. 12 is a plot of capacitance sensitivity using the invention and also the accuracy as compared to determining sensitivity using the traditional finite-difference perturbation analysis.
Figure 12B:
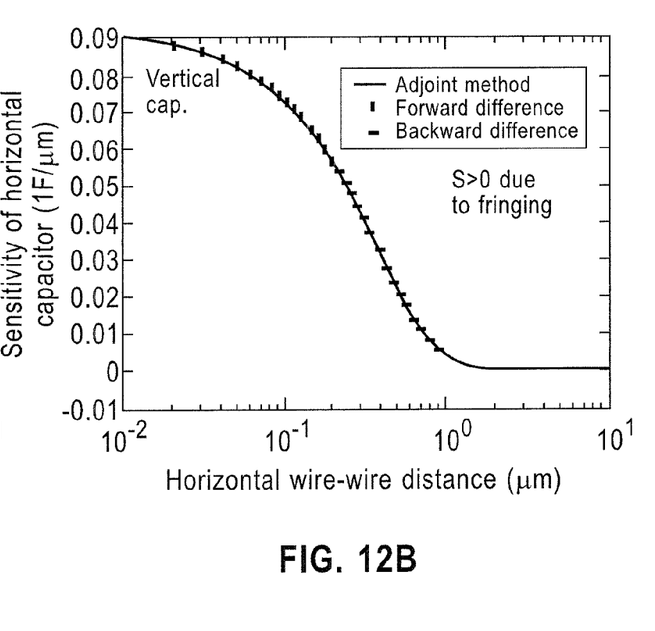

FIG. 12 shows capacitance sensitivity plots generated using the preferred embodiment of this invention. It also shows the accuracy of the method with respect to the traditional finite-difference perturbation analysis FIG. 12 (S91) are plots illustrating an advantageous feature of the present invention that results in sensitivity values that are more accurate than the ones produced by the so-called direct finite-difference method, whether forward or backward finite-differencing is used. The sensitivity values are for the parameters relative to two wires, such as 11 and 13 of FIG. 1 and the top metal layer 19. In plot A of FIG. 12 the horizontal (or lateral side-to-side) capacitance is plotted vs. the separation distance between the two neighboring wires. In plot B of FIG. 12, the vertical capacitance which includes both the parallel-plate and fringing capacitances from the left wire to the plane above is plotted vs. the separation distance between the two wires In plot A the solid line 117 is obtained with the method of the present invention. The values at the dot points 119 to the left of the line 117 are obtained with forward differencing using the prior art direct method and the values shown by the cross marks 121 to the right of the solid line with backward differencing. Note that the terms forward and backward refer to the particular direct method used and are not related to the forward and backward steps in the two-step method. This increased accuracy is obtained where it is most needed, namely in the region of the parameter space where the capacitance is most sensitive to small changes in the parameters.

Figure 13:
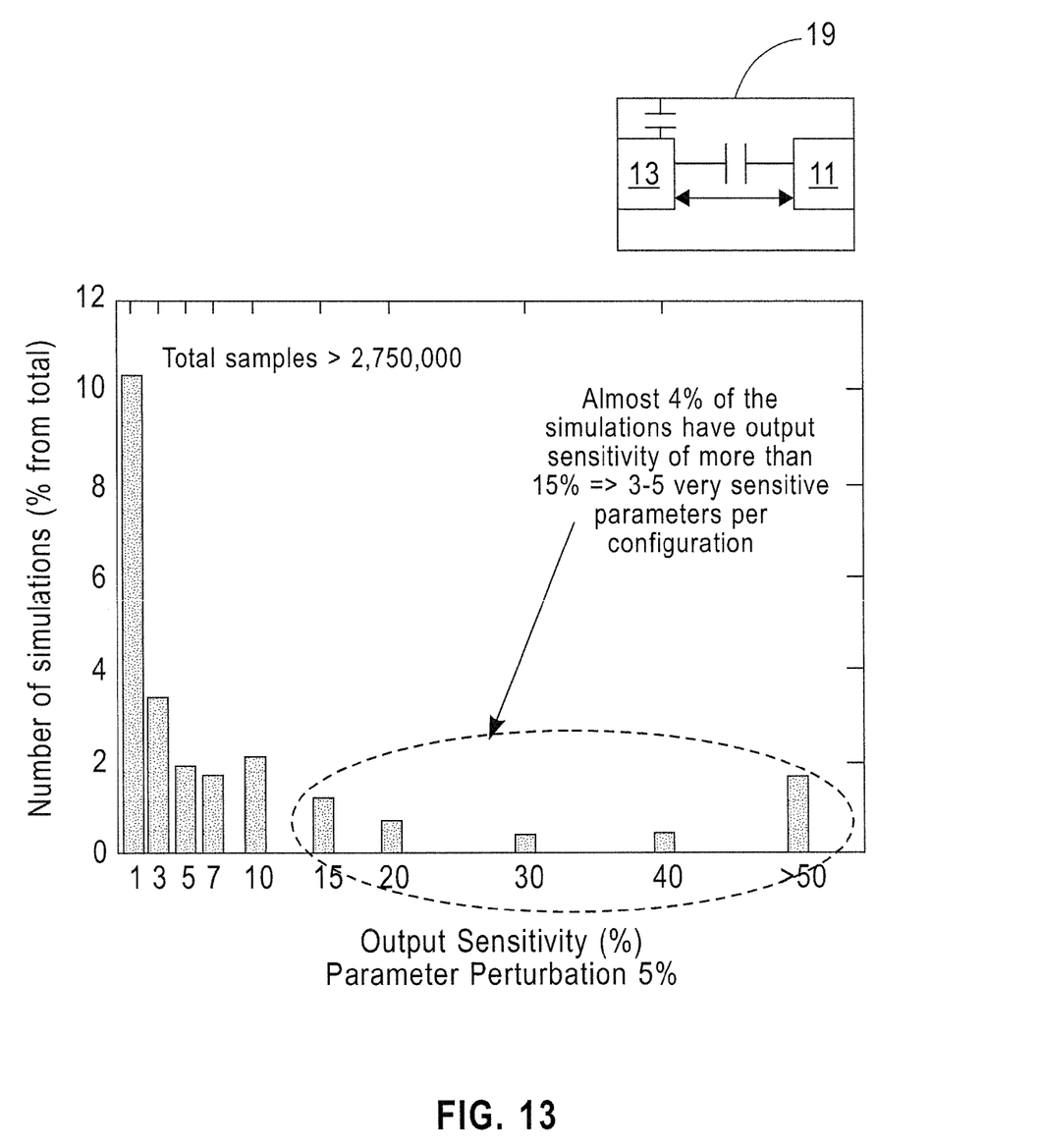
FIG. 13 is a plot showing the pruning of process parameters based on capacitance sensitivity analysis.
Figure 14:
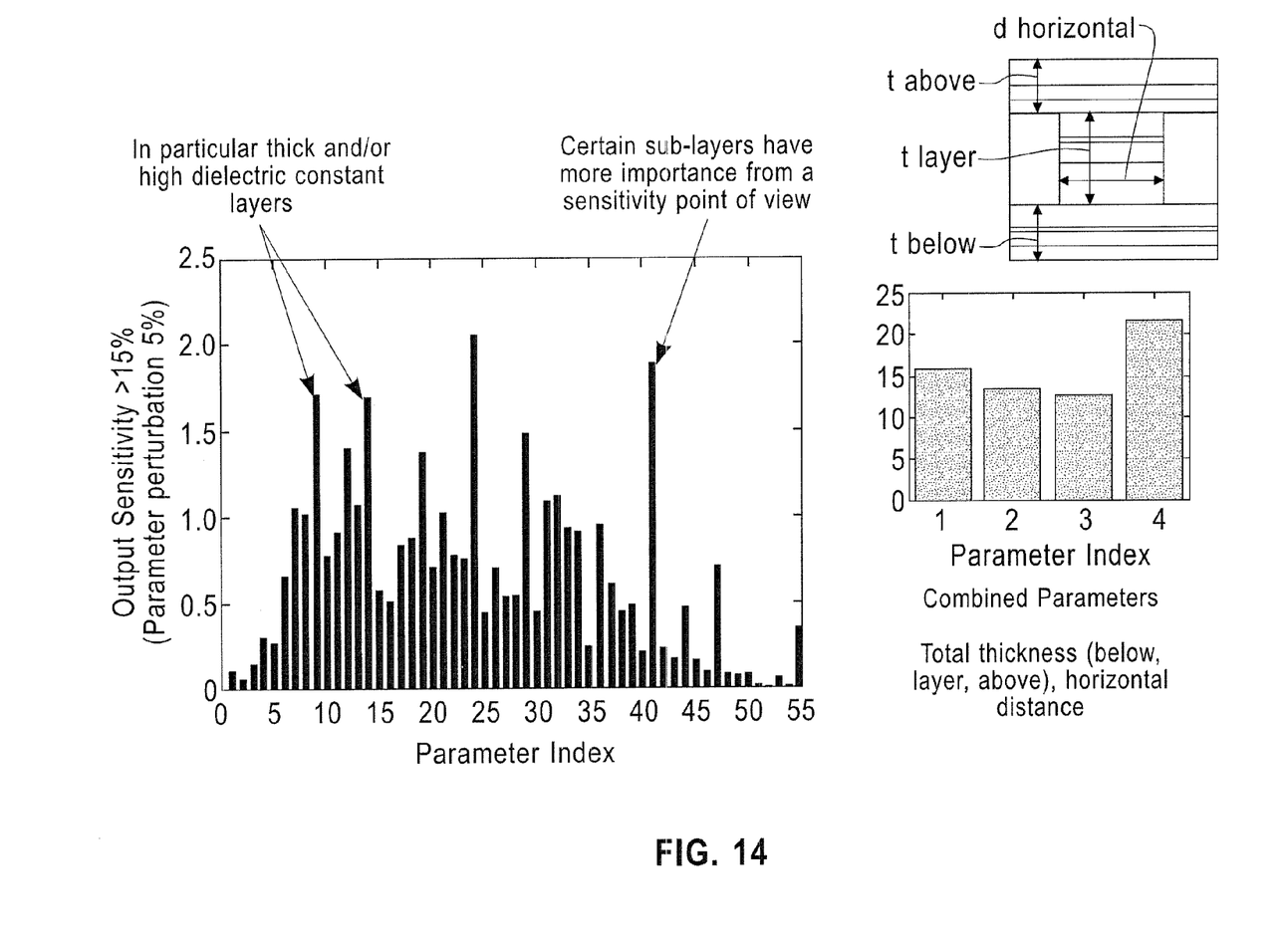
FIG. 14 is a is a chart showing the effect of certain of the parameters having the most impact on the electrical property.

An advantage of the invention is that it enables the important process of parameter pruning, that is, the selection of those parameters whose change most impact the electrical property under consideration. This is shown in FIGS. 13 and 14 (S110). The example in FIG.13 was run on a geometry of two wires 11 and 13 between the lower and upper metal layers 18 and 19. The horizontal scale is the sensitivity in terms of the percentage difference from the nominal value and vertical bars indicate the number of parameter sensitivities that scored at a given sensitivity percentage. It can be seen that several of the parameter sensitivities exceed 15%, meaning that such parameters would have a great effect during the circuit manufacturing process.

FIG. 14 is an illustrative example showing that although the number of parameters is large (over 60 parameters as shown in the horizontal scale of the graph on the left), each instance of the fundamental template is mostly sensitive to 3 or 4 parameters as shown by the higher vertical bars of the graph. This feature can be advantageously used in such areas as semiconductor processing, design for manufacturing (DFM), and layout extraction so as to reduce the number of parameters needed to conduct a full sensitivity analysis.

The teachings of the present invention can be readily included in computer-aided design tools such as full-chip or macro parameter extraction in order to evaluate the impact of manufacturing and design parameter tolerances on circuit performance. Furthermore the teachings of the present invention can be used in an optimization methodology to find the geometric circuit layouts that best satisfy one or several design criteria. Another outcome of the teachings is to enable a singie-run-muitipie-corner electrical verification methodology that would be much more efficient than the multiple-corner methodology. The preferred embodiment of this invention has the distinct advantage of being adapted, but not restricted, to the finite difference method for extracting electrical circuit parameters.

Further improvement in the efficiency of the preferred embodiment will come from its ability to work with iterative linear solvers. This is not the case for the method of Sutjahjo, et al in which a direct no-iterative solution of the linear system is computed based on the LU factorization.

Specific features of the invention are shown in one or more of the drawings for convenience only, as each feature may be combined with other features in accordance with the invention. Alternative embodiments will be recognized by those skilled in the art and are intended to be included within the scope of the claims. Accordingly, the above description should be construed as illustrating and not limiting the scope of the invention. All such obvious changes and modifications are within the patented scope of the appended claims.

We claim:

1. A method for determining nominal values of at least one electrical parameter for an integrated circuit comprised of a plurality of circuit elements, the method comprising:
producing, by a computer, a template which describes physical geometry of a portion of the integrated circuit, wherein the portion of the integrated circuit comprises at least two circuit elements disposed between two layers;
producing, by the computer, a grid of nodes for the template, wherein the grid of nodes is disposed in the space between the at least two circuit elements;
determining, by the computer, the nominal values of the at least one electrical parameter by using a nominal linear system that comprises a discretized linear system of equations descriptive of an electrical potential at the nodes of the grid of nodes, wherein determining the nominal values of the at least one electrical parameter comprises solving the nominal linear system to obtain a vector of potentials and using the obtained vector of potentials to obtain the nominal values of the at least one electrical parameter; and
determining, by the computer, sensitivity values for the at least one electrical parameter by applying an adjoint method to an auxiliary linear system, wherein determining the sensitivity values for the at least one electrical parameter comprises using the obtained vector of potentials, wherein the auxiliary linear system represents a relationship between an auxiliary vector and known relative variation with respect to discretized electrical quantities of the nodes, wherein determining the sensitivity values for the at least one electrical parameter comprises applying a two-step method, wherein the two-step method comprises an iterative procedure for solving finite-difference equations resulting from discretizing Laplace or Poisson partial differential equations in a rectangle.

2. The method of claim 1, wherein the grid of nodes is non-uniform.

3. The method of claim 1, wherein the at least one electrical parameter is one of: a capacitance value; a resistance value; an inductance value; or a reluctance value.

4. The method of claim 1, wherein the at least one electrical parameter is capacitance and the method determines the nominal values of side by side capacitance between two wires of the integrated circuit, the side by side capacitance including fringe capacitance, upper parallel plate capacitance, upper fringe capacitance, lower parallel plate capacitance and lower fringe capacitance.

5. The method of claim 1, wherein the nominal linear system is a function of a plurality of geometric parameters descriptive of at least one circuit element enclosed by the template.

6. The method of claim 5, further comprising: selecting, using the determined sensitivity values, certain ones of the plurality of geometric parameters whose change most impact the at least one electrical parameter.

7. The method of claim 5, wherein the plurality of geometric parameters comprises at least one of: a thickness of a circuit element, a thickness of a layer, a dielectric constant for a circuit element, a dielectric constant for a layer, a separation distance between two circuit elements, and a separation distance between two wires.

8. The method of claim 5, wherein a complexity for determining the sensitivity values for the at least one electrical parameter is independent of the number of geometric parameters in the plurality of geometric parameters.

9. The method of claim 1, wherein determining the nominal values of the at least one electrical parameter comprises applying a two-step method, wherein the two-step method comprises an iterative procedure for solving finite-difference equations resulting from discretizing Laplace or Poisson partial differential equations in a rectangle.

10. The computer readable memory medium of claim 1, wherein the nominal linear system is a function of a plurality of geometric parameters descriptive of at least one circuit element enclosed by the template.

11. The computer readable memory medium of claim 10, the actions further comprising: selecting, using the determined sensitivity values, certain ones of the plurality of geometric parameters whose change most impact the at least one electrical parameter.

12. The computer readable memory medium of claim 10, wherein the plurality of geometric parameters comprises at least one of: a thickness of a circuit element, a thickness of a layer, a dielectric constant for a circuit element, a dielectric constant for a layer, a separation distance between two circuit elements, and a separation distance between two wires.

13. The computer readable memory medium of claim 10, wherein a complexity for determining the sensitivity values for the at least one electrical parameter is independent of the number of geometric parameters in the plurality of geometric parameters.

14. A non-transitory computer-readable medium storing instructions that when executed by a computer cause the computer to take actions to determine nominal values of at least one electrical parameter for an integrated circuit comprised of a plurality of circuit elements, the actions comprising:
producing a template which describes physical geometry of a portion of the, wherein the portion of the integrated circuit comprises at least two circuit elements disposed between two layers;
producing a grid of nodes for the template, wherein the grid of nodes is disposed in the space between the at least two circuit elements;
determining the nominal values of the at least one electrical property by using a nominal linear system that comprises a discretized linear system of equations descriptive of an electrical potential at the nodes of the grid of nodes, wherein determining the nominal values of the at least one electrical parameter comprises solving the nominal linear system to obtain a vector of potentials and using the obtained vector of potentials to obtain the nominal values of the at least one electrical parameter; and
determining sensitivity values for the at least one electrical parameter by applying an adjoint method to an auxiliary linear system, wherein determining the sensitivity values for the at least one electrical parameter comprises using the obtained vector of potentials, wherein the auxiliary linear system represents a relationship between an auxiliary vector and known relative variation with respect to discretized electrical quantities of the nodes, wherein determining the sensitivity values for the at least one electrical parameter comprises applying a two-step method, wherein the two-step method comprises an iterative procedure for solving finite-difference equations resulting from discretizing Laplace or Poisson partial differential equations in a rectangle.

15. The computer-readable memory medium of claim 14, wherein the grid of nodes is non-uniform.

16. The computer-readable memory medium of claim 14, wherein the at least one electrical property is one of: a capacitance; a resistance; an inductance; or a reluctance.

17. The computer-readable memory medium of claim 14, wherein the at least one electrical property is capacitance and the actions determine the nominal values of side by side capacitance between two wires of the integrated circuit, the side by side capacitance including fringe capacitance, upper parallel plate capacitance, upper fringe capacitance, lower parallel plate capacitance and lower fringe capacitance.

18. The computer readable memory medium of claim 14, wherein determining the nominal values of the at least one electrical parameter comprises applying a two-step method, wherein the two-step method comprises an iterative procedure for solving finite-difference equations resulting from discretizing Laplace or Poisson partial differential equations in a rectangle.

* * * * *